US 6,444,512 B1

(12) United States Patent
Madhukar et al.

(10) Patent No.: US 6,444,512 B1
(45) Date of Patent: Sep. 3, 2002

(54) DUAL METAL GATE TRANSISTORS FOR CMOS PROCESS

(75) Inventors: Sucharita Madhukar; Bich-Yen Nguyen, both of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 88 days.

(21) Appl. No.: 09/592,448

(22) Filed: Jun. 12, 2000

(51) Int. Cl.[7] .................. H01L 21/8238; H01L 21/336
(52) U.S. Cl. ............... 438/203; 438/195; 438/216; 438/218; 438/283
(58) Field of Search .................. 438/203, 199, 438/216, 218, 283, 584, 588, 591, 592, 176, 177; 257/369, 72, 172, 774

(56) References Cited

U.S. PATENT DOCUMENTS

| | | | |
|---|---|---|---|
| 5,960,270 A | * | 9/1999 | Misra et al. ............. 438/197 |
| 6,066,533 A | | 5/2000 | Yu |
| 6,114,203 A | * | 9/2000 | Ghidini et al. ........... 438/201 |
| 6,121,094 A | * | 9/2000 | Gardner et al. .......... 257/774 |
| 6,174,775 B1 | * | 1/2001 | Liaw ..................... 257/369 |
| 6,248,630 B1 | * | 6/2001 | Clementi et al. ......... 438/258 |
| 6,248,675 B1 | * | 6/2001 | Xiang et al. ............ 438/166 |
| 6,271,094 B1 | * | 8/2001 | Boyd et al. ............. 438/287 |
| 6,291,282 B1 | * | 9/2001 | Wilk et al. .............. 438/199 |
| 6,300,203 B1 | * | 10/2001 | Buynoski et al. ........ 438/287 |
| 6,303,418 B1 | * | 10/2001 | Cha et al. ............... 438/199 |
| 6,329,233 B1 | * | 12/2001 | Pan et al. ............... 438/199 |

FOREIGN PATENT DOCUMENTS

| | | |
|---|---|---|
| EP | 0899784 A2 | 3/1999 |
| JP | 60045053 | 3/1985 |
| JP | 2000031291 | 1/2000 |
| JP | 2001196468 | 7/2001 |

OTHER PUBLICATIONS

Hiura et al, "Integration Technology of Polymetal (W/WSiN/Poly-Si) Dual Gate CMOS for 1Gbit DRAM's and Beyond," IEDM, 1998 pp. 389–392.*
Lu et al, "Dual–Metal Gate Technology for Deep Submicron CMOS Transistors," IEEE, Symposium on VLSI Technology Digest of Technical Paper, pp. 72–73 (2000).
Maiti et al., "Metal Gates for Advanced CMOS Technology," SPIE Conference on Microelectronic Device Technology III, SPIE vol. 3881, pp. 46–57 (1999).
Clafin et al., "High–K Dielectrics and Dual Metal Gates: Integration Issues for New CMOS Materials," Materials Research Society Symposium Proc. vol. 567, pp. 603–608 (1999).

* cited by examiner

Primary Examiner—Michael S. Lebentritt
(74) Attorney, Agent, or Firm—James L. Clingan, Jr.

(57) ABSTRACT

A process for forming a first transistor of a first conductivity type and a second transistor of a second conductivity type in a semiconductor substrate is disclosed. The substrate has a first well of the first conductivity type and a second well of the second conductivity type. A gate dielectric is formed over the wells. A first metal layer is then formed over the gate dielectric. A portion of the first metal layer located over the second well is then removed. A second metal layer different from said first metal is then formed over the wells and a gate mask is formed over the second metal. The metal layers are then patterned to leave a first gate over the first well and a second gate over the second well. Source/drains are then formed in the first and second wells to form the first and second transistor.

34 Claims, 4 Drawing Sheets

DUAL METAL GATE TRANSISTORS FOR CMOS PROCESS

FIELD OF THE INVENTION

The present invention is related to the field of semiconductor fabrication and more particularly to a fabrication process incorporating differing gate metals for n-channel and p-channel devices.

RELATED ART

In the field of semiconductor fabrication, it is typically desirable to fabricate n-channel and p-channel transistors with matching threshold voltages. In addition, it is desirable if the absolute value of the n-channel and p-channel threshold voltages are close to zero to increase the device speed. In conventional semiconductor processing, n-channel and p-channel threshold voltages are conventionally adjusted by a combination of channel implants and selective doping of a polysilicon gate. Typically, the use of channel implants is effective in adjusting the threshold voltages for n-channel devices but less effective for p-channel devices. In addition, the use of polysilicon gate structures is becoming unfeasible as gate dielectric thicknesses steadily decrease. More specifically, boron diffusion from p-type polysilicon gates into the transistor channel and poly depletion effects associated with devices having low thermal budget and thin gate oxides are making it increasingly difficult to incorporate polysilicon gates into advanced technologies. In addition, as semiconductor processing moves away from the use of silicon dioxide as a gate dielectric, chemical reactions between polysilicon and alternative gate dielectric structures render polysilicon less desirable as a gate of choice. Therefore, it would be highly desirable to implement a fabrication process in which n-channel and p-channel threshold voltages are matched and satisfactorily low. In addition, it would be desirable if the implemented process were compatible with alternative gate dielectric materials.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
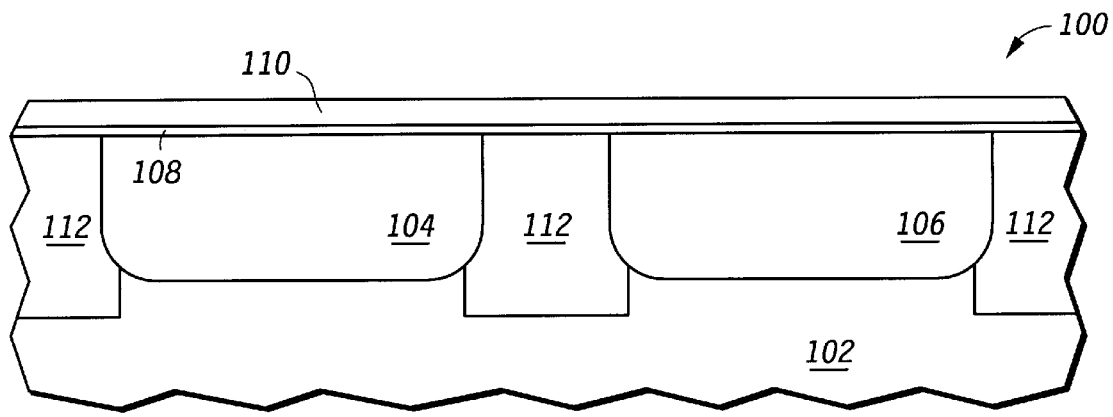
FIG. 1 is a partial cross sectional view of a partially completed semiconductor device according to one embodiment of the invention.

Turning now to the drawings, FIGS. 1–5 illustrate cross sectional views at various stages in one embodiment of a semiconductor process according to the present invention. In FIG. 1, a partially completed semiconductor device 100 is illustrated. Semiconductor device 100 as depicted in FIG. 1 includes a semiconductor substrate 102 into which a first well 104 and a second well 106 have been formed. Typically, semiconductor substrate 102 includes a lightly doped n-type or p-type single crystal silicon. The depicted embodiment of semiconductor device 100 is fabricated with a twin well process in which first well 104 is selectively implanted into portions of substrate 102 where devices of a first conductivity type will be formed while second well 106 is selectively implanted into regions of substrate 102 into which transistors of a second conductivity type will be formed. In one embodiment of the twin well process, the first well 104 may itself be enclosed within a tub (not depicted) in which the conductivity type of first well 104 and the tub are opposite. In another embodiment, substrate 102 may include a lightly doped epitaxial layer formed over a heavily doped bulk. In one embodiment, for example, the depicted portion of substrate 102 is a p– epitaxial layer formed over a p+ bulk, while first well 104 is doped n-type while second well 106 is p-type. N-type conductivity structures may be formed by implanting semiconductor substrate 102 with a suitable n-type impurity such as phosphorous or arsenic while p-type structures may be formed by implanting with a suitable p-type impurity such as boron. First well 104 and second well 106, as depicted in FIG. 1 are isolated from one another with trench isolation structures 112. Trench isolation structures 112 may comprise a suitable insulator such as a dielectric material. In the depicted embodiment of semiconductor device 100, first and second wells 104 and 106 are physically separated from one another by an intermediate isolation dielectric structure 112. Isolation dielectric 112 may include an oxide, nitride, or other suitable electrical insulator material.

A gate dielectric 108 is formed over first and second wells 104 and 106 of substrate 102. In one embodiment, gate dielectric 108 comprises a conventional, thermally formed silicon dioxide with a thickness of preferably less than 10 nanometers. In another embodiment, gate dielectric 108 may comprise an alternative gate material such as a transition metal oxide material. Such alternative gate dielectric materials are suitable for their high dielectric constant (K), which enables the use of a thicker gate dielectric layer without adversely affecting the electrical and capacitive characteristics of the film. For these alternative gate dielectrics, suitable transition metal oxide composites selected from oxides of zirconium, hafnium, aluminum, lanthanum, strontium, titanium, silicon and the combinations thereof As further depicted in FIG. 1, a first metal 110 of a first metal type is deposited over gate dielectric 108. As described in greater detail below, first metal 110 will be selectively removed from portions of semiconductor substrate 102 in which transistors of one conductivity type are fabricated such that first metal 110 will exist only where transistors of the other conductivity type are located. Preferably, first metal 110 is deposited with a chemical vapor deposition (CVD) process to protect the integrity of gate dielectric film 108. In an alternative embodiment, first metal 110 may be physical vapor deposited with a sputter process. In embodiments in which first metal 110 will ultimately remain on p-type transistors, it is desirable if the first metal type has a work function that is close to the valence band of silicon. In this embodiment, suitable metals for first metal 110 include rhenium (Re), iridium (Ir), platinum (Pt), and ruthenium oxide ($RuO_2$). In an embodiment in which first metal 110 remains on n-type transistors, it is desirable if first metal 110 has a work function that is close to the conduction band of silicon. In this embodiment, suitable metals for first metal 110 include titanium (Ti), vanadium (V), zirconium (Zr), molybdenum (Mo), tantalum (Ta), aluminum (Al), niobioum (Nb), and tantalum nitride (TaN).

Figure 2:
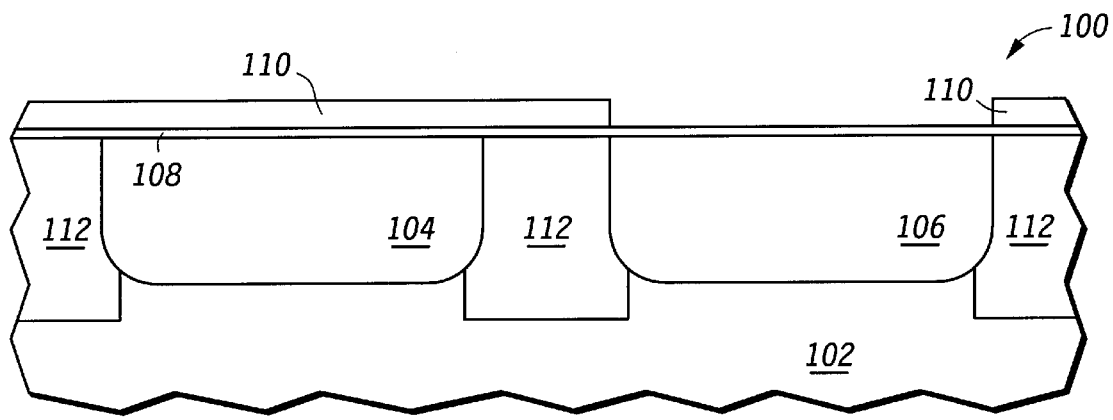
FIG. 2 is a processing step subsequent to FIG. 1 in which a first gate metal is selectively removed from portions of the semiconductor device.

Turning now to FIG. 2, a portion of first metal 110 has been selectively removed. In the depicted embodiment, the selective removal of first metal 110 is accomplished with a mask and etch process using the well mask used to form second well 106. In this embodiment, first metal 110 is removed over second well 106 (into which transistors of the second type will ultimately be fabricated). Thus, after transistor formation is completed, first metal 110 will remain in the structure of transistors of a first conductivity type while first metal 110 will not be present in transistors of the second conductivity type. The use of a critical dimension (CD) tolerant mask such as the second well mask to define the portions of first metal 110 selectively removed as shown in FIG. 2 is desirable because misalignment of the mask will not adversely affect subsequent processing.

Figure 3:
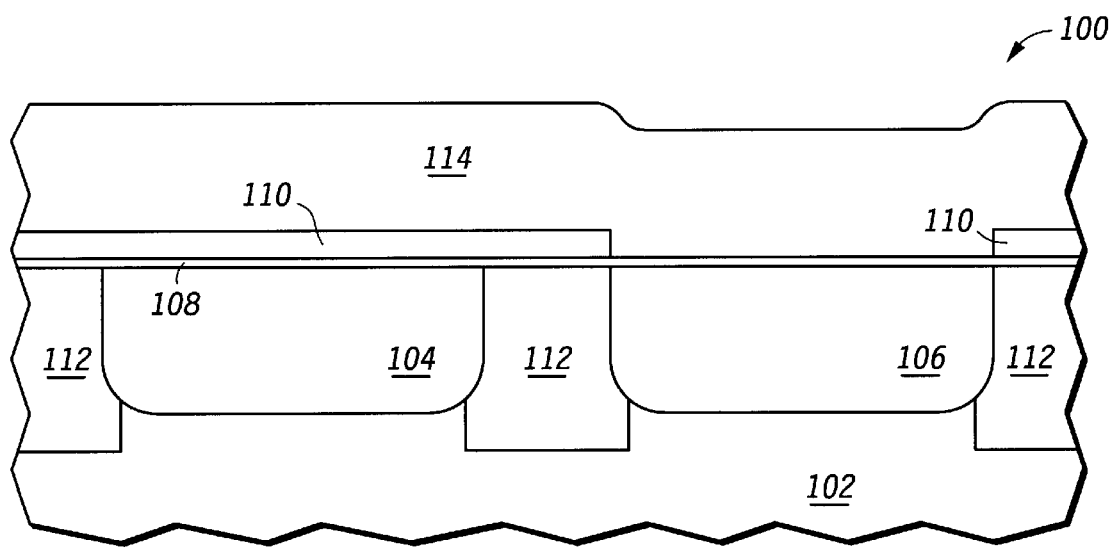
FIG. 3 is a partial cross sectional view subsequent to FIG. 2 in which a second gate metal is deposited over the first gate metal.

Turning now to FIG. 3, a second metal 114 is formed over the first and second wells 104 and 106 of semiconductor substrate 102 thereby covering first metal 110 and exposed portions of gate dielectric 108. Second metal 114 is of a second metal type where the second metal type has a different work function than the first metal type used for first metal 110. In embodiments where the first metal type used for first metal 110 has a work function that is close to the valence band of silicon, the second metal type used for second metal 114 has a work function close to the conduction band of silicon. Conversely, in embodiments where the first metal type used for first metal 110 has a work function that is close to the conduction band of silicon, the second metal type used for second metal 114 has a work function that is close to the valence band of silicon.

Preferably, first metal 110 and second metal 114, are formed such that the metal type with a work function close to the conduction band is in contact with gate dielectric 108 over p-well regions. In other words, it is desirable if n-channel transistors incorporate a metal on gate dielectric 108 that has a work function close to the conduction band of silicon while p-type transistors are fabricated with a gate metal on gate dielectric 108 that has a work function close to the valence band of silicon. If, for example, first well 104 is an n-well structure over which p-type transistors are fabricated, the work function of first metal 110 is preferably close to the valence band of silicon while second metal 114, which is on gate dielectric 108 over p-well regions of substrate 102, will have a work function that is close to the conduction band of silicon.

Preferably second metal 114 is thicker than first metal 110. In one embodiment, the thickness of second metal 114 is at least two times thicker than the thickness of first metal 110 and is, still more preferably, at least ten times thicker. The thickness of first metal 110 in one embodiment is less than approximately 100 Å while the thickness of second metal 114 is in the range of approximately 200–2000 Å. Like first metal 110, second metal 114 is preferably formed with a CVD deposition process to protect the integrity of the portions of dielectric film 108 that are exposed during the deposition of second metal 114.

Figure 4:
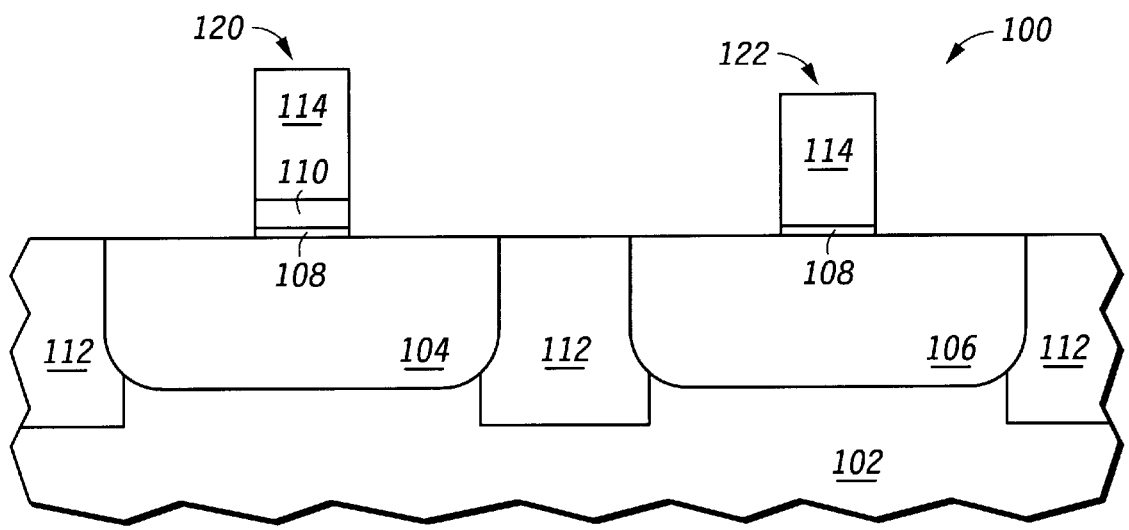
FIG. 4 is a processing step subsequent to FIG. 3 in the deposited metals are patterned into gate structures.

Turning now to FIG. 4, semiconductor device 100 is depicted after a gate mask and etch process have been performed to pattern first metal layer 110 and second metal layer 114 resulting in the formation of a first gate 120 over first well 104 and a second gate 122 over second well 106. First gate 120 includes a first metal 110 on gate dielectric 108 and a second metal 114 formed on first metal 110. In contrast, second gate 122 includes second metal 114 in contact with gate dielectric 108. Because the second metal 114 is an order of magnitude thicker than first metal 110, first and second gates 120 and 122 are substantially similar in physical dimension thereby minimizing processing difficulties associated with differing thickness. It will be appreciated by those in the field having the benefit of this disclosure that the use of a first metal 110 of a first metal type in contact with gate dielectric 108 for transistors of a first conductivity type coupled with the use of a second metal 114 of a second metal type (where the first and second metal types differ) in contact with gate dielectric layer 108 for the second type of transistors enables the threshold voltage alignment of n-channel and p-channel devices while avoiding difficulties associated with polysilicon gates including boron diffusion, polysilicon depletion effects, and potential incompatibility with alternative gate dielectric films. Because first metal 110 is selectively removed from appropriate portions of substrate 102 prior to formation of first and second gates 120 and 122, only a single mask and etch step is required to form first and second gates 120 and 122. Thus, the first and second metals of first gate 120 are self-aligned. In addition, the invention is implemented without introducing misalignment between first and second gates 120 and 122 that could affect subsequent photolithography steps. While the depicted embodiment of first gate 120 includes two metals and second gate 122 includes a single metal, additional metals or other conductive elements may be added to each gate stack such that, for example, first gate 120 comprises a three layer stack while second gate 122 is a two layer stack. In such an embodiment, first gate 120 could include a platinum first metal 110, a tantalum nitride (TaN) second metal 114, and a tungsten (W) third metal (not depicted in FIG. 4). In this embodiment, second gate 114 would include a TaN first metal and a W second metal. The third metal layer could also be implemented with another conductive material such as doped polysilicon.

Figure 5:
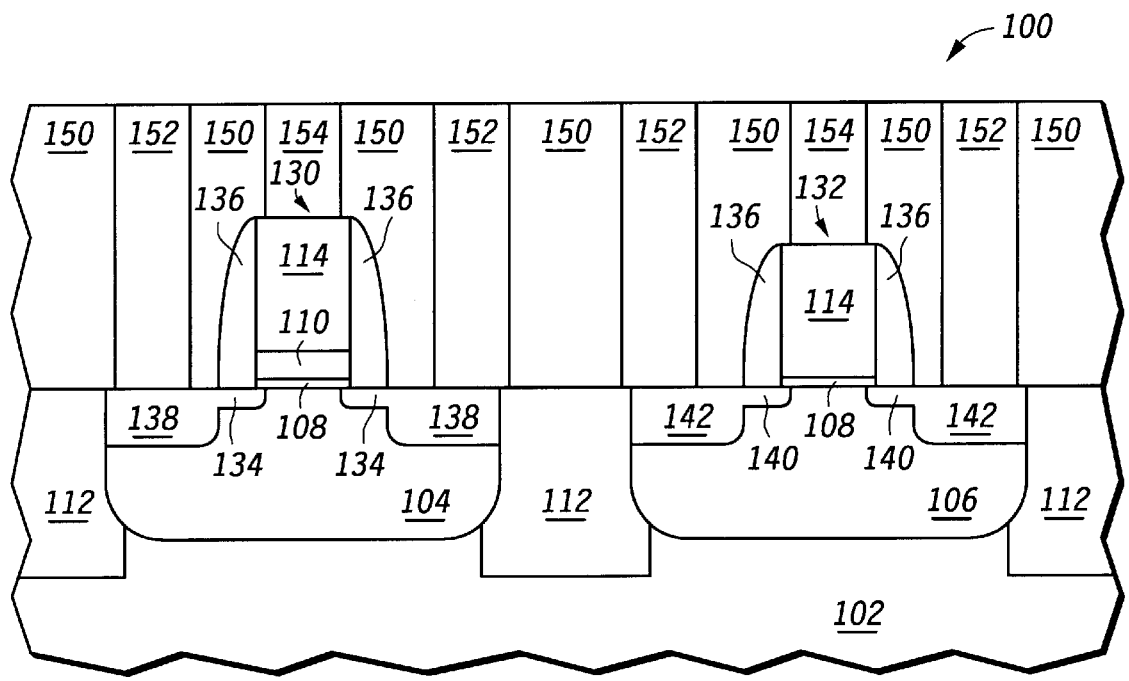
FIG. 5 is a processing step subsequent to FIG. 4 in which n-channel and p-channel transistors have been formed.

Turning now to FIG. 5, the portions of semiconductor device 100 relevant to this disclosure are completed by fabricating a first transistor 130 of a first conductivity type and second transistor 132 of a second conductivity type. First transistor 130 is fabricated by performing appropriate source/drain implants and fabricating appropriate sidewall structures. In the depicted embodiment, first transistor 130 includes a lightly doped drain (LDD) 134 prior to forming sidewalls 136 and thereafter implanting a heavily doped impurity distribution to form source/drain regions 138 all as will be familiar to those in the field of semiconductor processing.

Similarly, second transistor 132 is formed by implanting a lightly doped impurity distribution 140, fabricating sidewalls 136 and thereafter implanting heavily doped source/drain regions 142 and embodiments where first transistor 130 is a p-type transistor, impurity distributions 134 and 138 are p-type impurity distributions of boron or other suitable p-type dopant. In embodiments where a first transistor 130 is an n-type transistor impurity distributions 134 and 138 are n-type impurity distributions of phosphorous, arsenic, or other suitable n-type dopant. Sidewalls 136 are preferably comprised of a dielectric material such as, for example, silicon nitride.

Semiconductor device 100 as depicted in FIG. 5 further includes an interlevel dielectric layer 150 as well as a pair of contacts 152 to source/drain regions 138 and a pair of contacts 154 to first gate 120 and second gate 122. Contacts 154 and 152 are typically comprised of a third metal such as tungsten.

Semiconductor device 100 may be fabricated with alternative fabrication techniques or process flows including, as an example, the replacement gate fabrication technique, in which the source/drain regions are implanted prior to the formation of the gate dielectric 108 and first metal 110. In this technique, as depicted in FIGS. 6A through 6E, source/drain regions 138 and 142 are implanted into substrate 102 using replacement gate structures 160 as an implant mask. Replacement gate structures 160 are patterned on an oxide film 161 using the gate mask. Replacement gate structures 160 are typically comprised of a material, such as poly silicon, that exhibits good etch selectivity with respect to silicon dioxide.

Figure 6A:
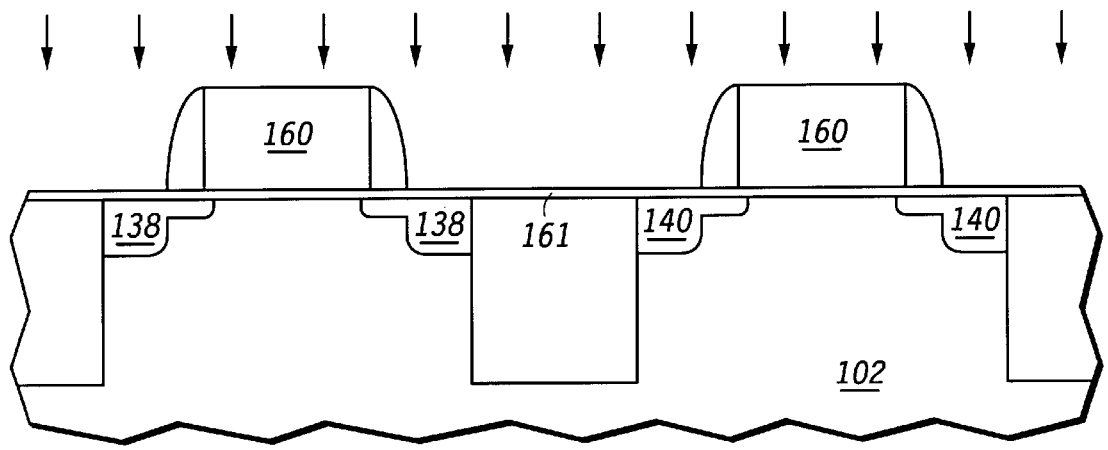
FIGS. 6A through 6E illustrate an alternative process flow for forming a semiconductor device according to the present invention.
Figure 6B:
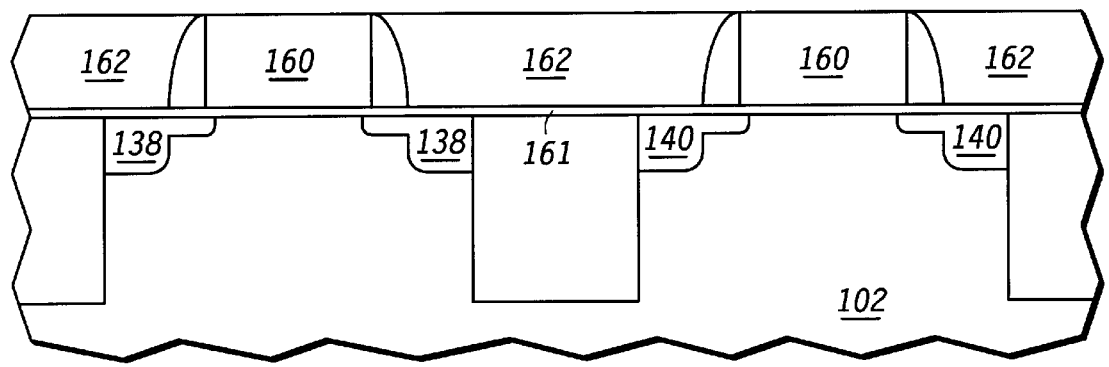
Figure 6C:
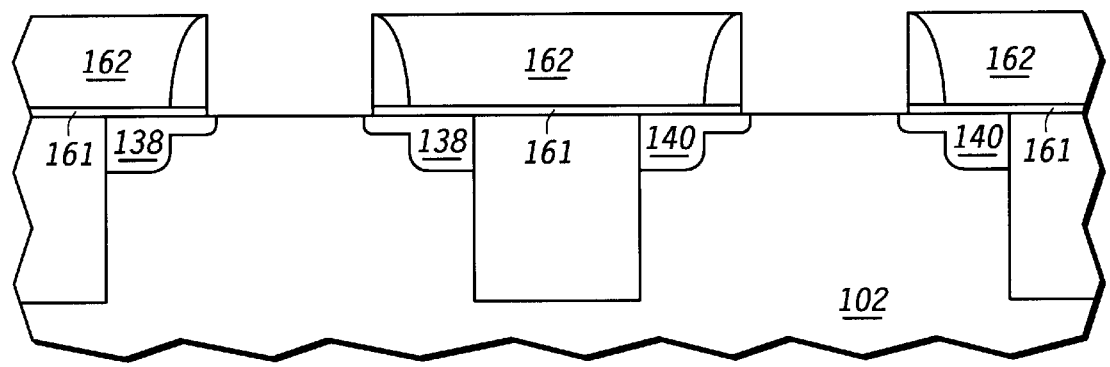
Figure 6D:
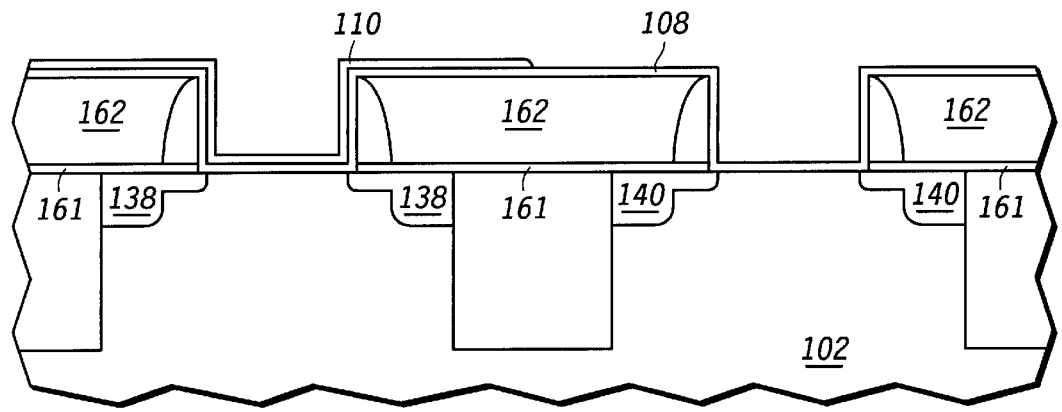
Figure 6E:
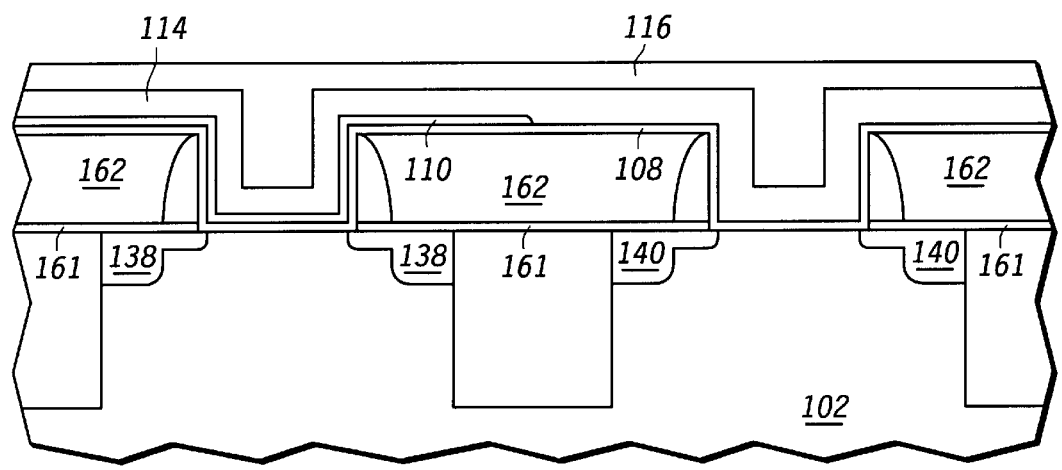
Figure 6F:
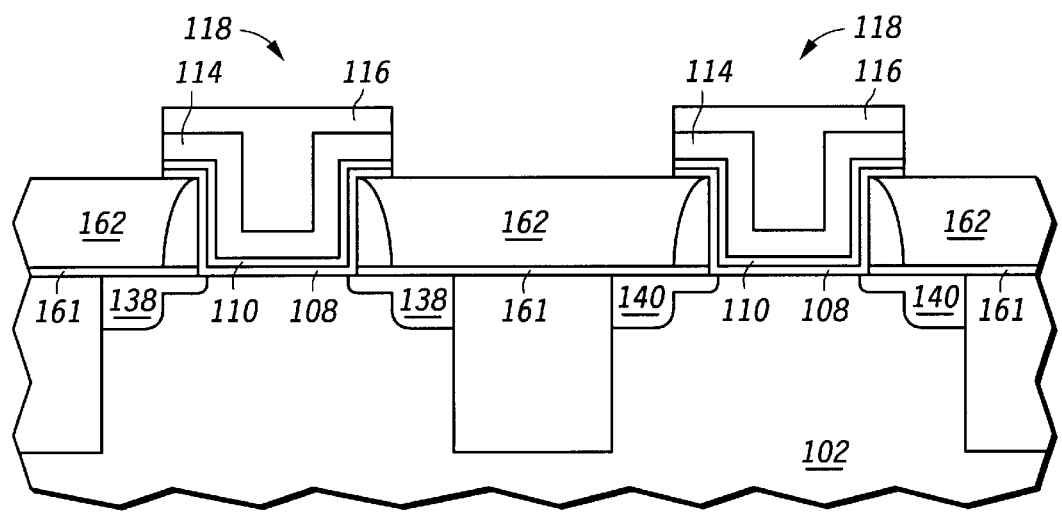

Following the formation of replacement gates 160, structures 162 are fabricated by blanket depositing a film, such as CVD oxide on the substrate and then polishing the deposited layer to expose an upper surface of the replacement gates 162 (FIG. 6B). In FIG. 6C, replacement gates 160 are etched away leaving behind structures 162. In FIG. 6D, gate dielectric 108 is formed over the entire wafer and first metal 110 is selectively formed over p-channel regions as described previously. In FIGS. 6E and 6F, a second metal 114, and a third metal 116 are deposited and the stack (comprised of gate oxide 108, first metal 110, second metal 114 and third metal 116 are etched to form gate structures 118. In one embodiment, first metal 110, second metal 114, and third metal 116 are platinum, tantalum nitride, and tungsten respectively. In this case gate structures 118 have extensions over their respective source/drains. The gate is over the channel and adjacent to the source/drains and has an extension The extension and the gate comprise the gate structure 118.

The replacement gate technique described herein beneficially places the source/drain implants and dopant activation anneals prior to the deposition of the gate dielectric, first and second metal layers 110 and 112 respectively. One of the advantages of this process is that the high temperature dopant activation anneals, which may be detrimental to the quality of the gate dielectric and the first and second metals, will be performed prior to the deposition of the dielectric and metal layers.

Although the invention has been described with respect to specific conductivity types or polarity of potentials, skilled artisans appreciated that conductivity types and polarities of potentials may be reversed.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a first transistor of a first conductivity type and a second transistor of a second conductivity type in a semiconductor substrate having a first well of the first conductivity type and a second well of the second conductivity type, comprising the steps of:

forming a gate dielectric over the first and second wells;

forming a first metal layer of a first metal type over the gate dielectric;

removing a first portion of the first metal layer, the first portion being over the second well;

then forming a second metal layer of a second metal type different from said first metal type over the first and second wells;

forming a gate mask over the first well and the second well;

patterning the first metal layer and the second metal layer according to the mask to leave a first gate over the first well and a second gate over the second well;

forming a first source and a first drain of the second conductivity type in the first well adjacent to the first gate to form the second transistor; and forming a second source and second drain of the first conductivity type in the second well adjacent to the second gate to form the first transistor.

2. The method of claim 1, wherein the gate dielectric is a transition metal oxide.

3. The method of claim 1, wherein the first layer has a first thickness and the second layer has a second thickness, and wherein the second thickness is greater than the first thickness.

4. The method of claim 3, wherein the second thickness is at least two times greater than the first thickness.

5. The method of claim 4, wherein the step of forming the first metal layer comprises depositing tantalum nitride by chemical vapor deposition.

6. The method of claim 5, wherein the step of forming the second metal layer comprises depositing platinum by chemical vapor deposition.

7. The method of claim 6, wherein the transition metal oxide is selected from oxides of Zirconium, Hafnium, Aluminum, Lanthanum, Silicon, Titanium and combinations thereof.

8. The method of claim 1, wherein the first metal type is selected from tantalum nitride, niobium, aluminum, tantalum, molybdenum, and zirconium, vanadium, and titanium.

9. The method of claim 8, wherein the second metal type is selected from iridium, platinum, rhenium, and ruthenium oxide.

10. The method of claim 9, wherein the gate dielectric is selected from oxides of Zirconium, Hafnium, Aluminum, Lanthanum, Silicon, Titanium and combinations thereof.

11. The method of claim 10, wherein the substrate comprises a silicon layer on an insulator.

12. The method of claim 11, wherein the first conductivity type is P type and the second conductivity type is N type.

13. The method of claim 1, wherein the second metal type is selected from tantalum nitride, niobium, aluminum, tantalum, molybdenum, and zirconium, vanadium, and titanium.

14. The method of claim 13, wherein the first metal type is selected from iridium, platinum, rhenium, and ruthenium oxide.

15. The method of claim 14, wherein the gate dielectric is selected from oxides of Zirconium, Hafnium, Aluminum, Lanthanum, Silicon, Titanium and combinations thereof.

16. The method of claim 15, wherein the first conductivity type is N type and the second conductivity type is P type.

17. The method of claim 16, wherein the second metal layer is thicker than the first metal layer.

18. The method of claim 17, wherein the second metal layer is at least two times thicker than the first metal layer.

19. A method for forming a first transistor of a first conductivity type and a second transistor of a second conductivity type in a semiconductor substrate having a first well of the first conductivity type and a second well of the second conductivity type, comprising the steps of:

forming a first removable gate over the first well and a second removable gate over the second well;

forming a first source and a first drain of the second conductivity type in the first well adjacent to the first removable gate;

forming a second source and second drain of the first conductivity type in the second well adjacent to the second removable gate;

removing the first and second removable gates;

forming a gate dielectric over the first and second wells;

forming a first metal layer of a first metal type over the gate dielectric;

removing a first portion of the first metal layer, the first portion of the first metal layer being over the second well;

then forming a second metal layer of a second metal type different from said first metal type over the first and second wells; and removing a first portion of the second metal layer, the first portion of the second metal layer being between the first and second wells;

whereby a first transistor is formed in the second well and a second transistor is formed in the first well.

20. The method of claim 19, wherein the gate dielectric is a transition metal oxide.

21. The method of claim 19, wherein the first layer has a first thickness and the second layer has a second thickness, and wherein the second thickness is greater than tie first thickness.

22. The method of claim 21, wherein the second thickness is at least two times greater than the first thickness.

23. The method of claim 22, wherein the step of forming the first metal layer comprises depositing tantalum nitride by chemical vapor deposition.

24. The method of claim 22, wherein the step of forming the second metal layer comprises depositing platinum by chemical vapor deposition.

25. The method of claim 24, wherein the transition metal oxide is selected from oxides of Zirconium, Hafnium, Aluminum, Lanthanum, Silicon, Titanium and combinations thereof.

26. The method of claim 1, wherein the first metal type is selected from tantalum nitride, niobium, aluminum, tantalum, molybdenum, and zirconium, vanadium, and titanium.

27. The method of claim 25, wherein the second metal type is selected from iridium, platinum, rhenium, and ruthenium oxide.

28. The method of claim 27, wherein the gate dielectric is selected from oxides of Zirconium, Hafnium, Aluminum, Lanthanum, Silicon, Titanium and combinations thereof.

29. The method of claim 28, wherein the substrate comprises a silicon layer on an insulator.

30. The method of claim 19, wherein the second metal type is selected from tantalum nitride, niobium, aluminum, tantalum, molybdenum, and zirconium, vanadium, and titanium.

31. The method of claim 30, wherein the first metal type is selected from iridium, platinum, rhenium, and ruthenium oxide.

32. The method of claim 31, wherein the gate dielectric is selected from oxides of Zirconium, Hafnium, Aluminum, Lanthanum, Silicon, Titanium and combinations thereof.

33. The method of claim 32, wherein the second metal layer is thicker than the first metal layer.

34. The method of claim 33, wherein the second metal layer is at least two times thicker than the first metal layer.

* * * * *